(12) United States Patent
Fröhlich et al.

(10) Patent No.: US 7,791,411 B2
(45) Date of Patent: Sep. 7, 2010

(54) AMPLIFIER ARRANGEMENT AND METHOD FOR AMPLIFYING A SIGNAL

(75) Inventors: Thomas Carl Fröhlich, Zürich (CH); Nicole Heule, Jona (CH)

(73) Assignee: Austriamicrosystems AG, Unterpremstatten (AT)

( * ) Notice: Subject to any disclaimer, the term of this patent is extended or adjusted under 35 U.S.C. 154(b) by 27 days.

(21) Appl. No.: 11/820,447

(22) Filed: Jun. 19, 2007

(65) Prior Publication Data

US 2008/0036540 A1    Feb. 14, 2008

(30) Foreign Application Priority Data

Jun. 19, 2006   (DE) ..................... 10 2006 028 093

(51) Int. Cl.
*H03F 1/24*        (2006.01)
(52) U.S. Cl. .................. 330/98; 330/278; 330/310; 330/311; 330/150
(58) Field of Classification Search ................... 330/98, 330/278, 310, 311, 150
See application file for complete search history.

(56) References Cited

U.S. PATENT DOCUMENTS

| | | | | |
|---|---|---|---|---|
| 4,241,316 A | * | 12/1980 | Knapp | ......................... 330/277 |
| 5,032,799 A | * | 7/1991 | Milberger et al. | ............ 330/311 |
| 5,838,199 A | * | 11/1998 | Nakamura | ................... 330/258 |
| 5,986,502 A | * | 11/1999 | Nakamura | ................... 330/258 |
| 6,366,165 B1 | * | 4/2002 | Huijsing et al. | ............. 330/252 |
| 6,384,687 B1 | * | 5/2002 | Maida | ......................... 330/296 |
| 6,407,636 B1 | * | 6/2002 | Goutti | ......................... 330/255 |
| 7,071,784 B2 | * | 7/2006 | Seremeta | .................... 330/311 |
| 7,245,189 B2 | * | 7/2007 | Seremeta | .................... 330/311 |
| 2004/0257160 A1 | * | 12/2004 | Wang | ......................... 330/253 |
| 2008/0272844 A1 | * | 11/2008 | Rayanakorn et al. | ........ 330/253 |

FOREIGN PATENT DOCUMENTS

| DE | 1 139 155 | 11/1962 |
|---|---|---|
| DE | 1 926 736 | 2/1971 |

OTHER PUBLICATIONS

U. Tietze et al., "Halbleiter-Schaltungstechnik", ISBN 3-540-64192-0, pp. 425-427 and pp. 484-487, 2000.

\* cited by examiner

*Primary Examiner*—Patricia Nguyen
(74) *Attorney, Agent, or Firm*—Cohen Pontani Lieberman & Pavane LLP

(57) ABSTRACT

An amplifier arrangement and a method for amplifying a signal, the arrangement including a transistor to amplify an input signal and to provide an intermediate signal. The intermediate signal is amplified to form an output signal which is fed back to the transistor.

18 Claims, 3 Drawing Sheets

AMPLIFIER ARRANGEMENT AND METHOD FOR AMPLIFYING A SIGNAL

RELATED APPLICATION

This patent application claims the priority of German patent applications 10 2006 028 093.8 filed Jun. 19, 2006, the disclosure content of which is hereby incorporated by reference.

FIELD OF THE INVENTION

The present invention relates to an amplifier arrangement and to a method for amplifying a signal.

BACKGROUND OF THE INVENTION

MEMS (Micro Electro-Mechanical Systems) applications, for example, often require signal amplifiers having a small area requirement, a low input capacitance, a high input impedance, a small current requirement and low noise. A rail-to-rail AB output stage, current feedback and input signal levels up to the supply voltage, for example an input signal based on a negative or positive supply, are also desirable.

In a conventional amplifier, a sufficient gain can be provided using a transistor in a source-follower configuration, as an input buffer, and a downstream differential amplifier. In this case, the differential amplifier comprises a feedback voltage divider on the output side.

However, the problem with such an amplifier is that there is a relatively high noise level.

Alternatively, an input signal based on a reference between the supply voltages could also be used. However, the power consumption, the complexity of the circuit and the noise would be greater as a result. In the case of a fully differential stage based on the supply voltage Vss, additional common mode potential regulation would be required. This would likewise result in undesirable circuit complexity, noise and power consumption. Alternatively, an input transistor of an amplifier could also be connected into the source circuit. However, the gate-source capacitance would be present at the input node as a result. This would result in undesirable loading of the signal source. In addition, stray capacitances at the input could not be shielded.

SUMMARY OF THE INVENTION

It is an object of the present invention to provide an amplifier arrangement and a method for amplifying a signal, in which signals can be amplified with low noise and little complexity.

As regards the arrangement, the object is achieved, by means of an amplifier arrangement having an input stage comprising a transistor which is connected to an input for supplying an input signal, at least one output stage which is coupled to the transistor at an input of the output stage and provides an output signal at an output, and a feedback path which connects the output of the output stage to the transistor.

One embodiment provides a multistage amplifier arrangement. The amplifier arrangement comprises an input stage with a downstream output stage. The input stage itself comprises a transistor which can be supplied, at an input, with an input signal to be amplified. An output of the input stage is coupled to an input of an output stage, if appropriate via further components or functional blocks. The output stage provides an output signal which is derived from the input signal of the input stage and is amplified.

The feedback path according to the proposed principle does not only include the output stage but feeds the output of the output stage back to the transistor.

According to the proposed principle, the noise is considerably reduced on account of signal amplification as early as in the input stage. The linearity is high on account of the closed control loop. Temperature-dictated scattering, process-dictated scattering and scattering which is dependent on the supply voltage are low.

The transistor of the input stage is preferably connected in such a manner that an input for supplying the input signal of the amplifier arrangement is formed at a control connection of the transistor. The connections of the controlled path of the transistor are preferably connected in such a manner that one of the connections forms an output of the input stage and is connected to the output stage and another connection of the controlled path of the transistor of the input stage is connected to the feedback path.

The transistor is preferably in the form of a PMOS transistor. However, implementation using NMOS is also possible.

The feedback path is preferably set up to set the gain.

For example, the feedback path may comprise a series resistor. A parallel path may be additionally or alternatively provided. One connection of the parallel path is preferably connected to the feedback path on the transistor side. The parallel path comprises, for example, a series circuit comprising a further resistor or/and a capacitance. The parallel path may be connected to a supply or reference potential.

The output stage itself preferably likewise comprises at least one transistor. In one embodiment, the output stage is a Class AB stage, for example.

In order to avoid an undesirable Miller effect which may occur, the input stage may comprise a cascode stage in addition to the transistor. In one embodiment, the cascode stage may comprise a cascode transistor. The cascode transistor is preferably connected between the transistor of the input stage and that output of the input stage to which the output stage is coupled.

The input stage may additionally or alternatively comprise a bias current source.

In one embodiment, the input stage comprises a resistor. The resistor can be used, for example, to set the gain of the input stage.

A current source can alternatively be used instead of the resistor or in parallel with the resistor.

In one embodiment, the input stage comprises a current path which is connected between the supply and reference potential connections. A bias current source is provided on the supply potential side, the transistor, possibly the output transistor and the resistor being connected to said current source in a series circuit.

The transistor is preferably connected in such a manner that, in addition to its function as an input stage, the level of the input signal is converted to form a preamplified intermediate signal. In addition, the transistor is used for level conversion (DC offset) between the feedback path and the input signal.

As regards the method, the object is achieved by means of a method for amplifying a signal, said method comprising the following features: amplifying an input signal using a transistor and providing an intermediate signal which is derived from the input signal, amplifying the intermediate signal and providing an output signal which is derived from the intermediate signal, feeding a feedback signal, which is derived from the output signal, back to the transistor.

One development provides for the transistor to be connected for the purpose of carrying out level conversion.

The process of feeding the output signal back to the transistor preferably involves a resistance network, the resistance network comprising at least two resistors in one embodiment. The gain can be set on the basis of the resistance ratio.

The intermediate signal is preferably tapped off at a connection of the controlled path of the transistor, the output signal which has been fed back being supplied to the transistor at another connection of the controlled path.

In addition to the input signal to be amplified and the feedback signal, a bias current is preferably supplied to the transistor.

An input stage comprising the transistor can preferably be amplified using a resistor which is connected to the transistor.

BRIEF DESCRIPTION OF THE DRAWINGS

The invention is explained in more detail below using a plurality of exemplary embodiments and with reference to drawings, in which.

DETAILED DESCRIPTION OF THE DRAWINGS

Figure 1:
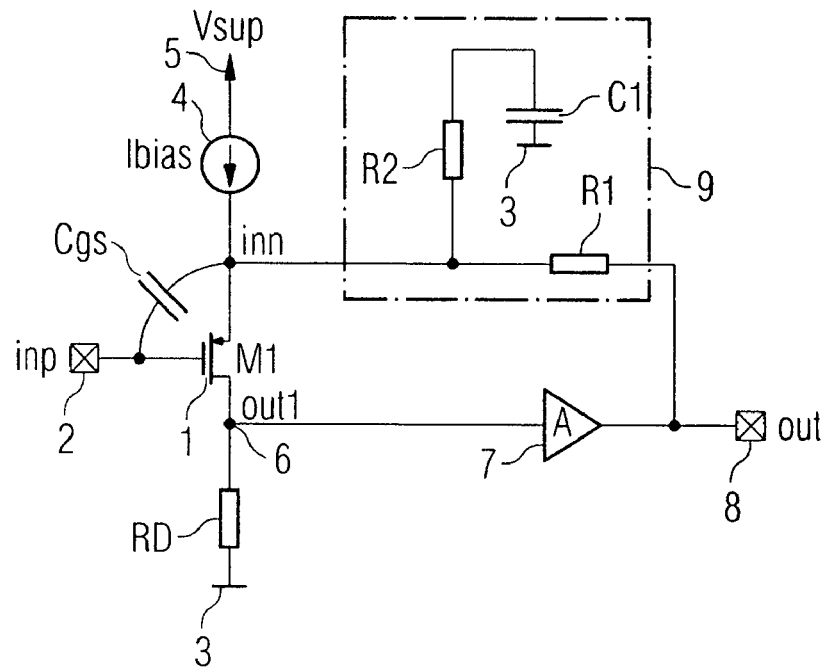
FIG. 1 shows a first exemplary embodiment of an amplifier arrangement according to the proposed principle.

FIG. 1 shows an amplifier arrangement having an input stage and an output stage. The input stage comprises a transistor 1 which is connected to an input 2 for supplying a signal inp to be amplified in a controlled path formed between source and drain of transistor 1. In this case, the transistor 1 is in the form of a P-channel MOS-type field effect transistor. A reference potential connection 3 is connected to the drain connection of the transistor 1 via a resistor RD. In contrast, the source connection of the transistor 1 is connected to a supply voltage connection 5 via a bias current source 4. A supply voltage Vsup can be supplied at the supply voltage connection 5.

The gate-source capacitance which can be inherently assigned to the transistor 1 is depicted in FIG. 1 for the purpose of explaining the method of operation but is not necessarily present as a discrete component.

A circuit node 6 is also formed with a connection of the controlled path at the drain of the transistor 1. The circuit node 6 is connected to an output 8 of the amplifier arrangement via an output stage 7. An output signal "out" is provided at said output 8. The output 8 is also connected to another connection of the controlled path, formed at the source of the transistor 1, via a feedback path 9 and provides a feedback signal "inn" there. The feedback path 9 comprises a series resistor R1 having one lead connected to output 8, its other lead to a parallel path which comprises a series circuit comprising a resistor R2 and a capacitance C1 that is connected to a reference potential connection 3. The gain can be set by selecting a ratio of R1:R2.

The input stage accordingly comprises the transistor 1, the resistor RD and the bias current source 4. The transistor 1 amplifies the input signal "inp" applied to the input 2 and provides an amplified input signal in the form of an intermediate signal "out1" at the circuit node 6. This intermediate signal "out1" is amplified further by the output stage 7.

It is desirable to have the DC operating point at the input of the amplifier be at ground (VSS or negative voltage supply). As a consequence, a negative supply can be used as a reference in the overall system (including on the input side and output side). Alternatively, it is also possible to use a positive voltage supply as a reference. In this case, PMOS transistors M1 at the input side should be replaced by an NMOS.

It is also desirable that the DC operating point at the output be between the voltage supply potentials, namely VDD/2 for example. This allows for maximum AC operating range at a given supply voltage. However, the DC operating point on the output side should not be directly derived from VDD in order to avoid potential negative influence from power supply disturbances on the output signal.

The level conversion, i.e. voltage offset between Input (e.g. VSS) and Output (e.g. VDD/2) corresponds, depending on the technology used and depending on the supply voltage range, roughly to the threshold voltage of the MOS transistor. This threshold voltage corresponds to the voltage present between drain and source of transistor M1 (i.e. the PMOS on the input side). This results in an ideal operating point at both input and output side using the input stage with transistor M1.

In addition, the transistor 1 carries out level conversion between the input 2 and the circuit node 6. Signal amplification is additionally carried out. The gain of the transistor 1 can be calculated, to a first approximation, from the product of the transconductance gm of the transistor M1 and the resistance of the resistor RD.

This dual function of the transistor 1 is a significant advantage since the dominant noise of the circuit is limited by the input transistor 1. The noise is considerably lower than would be the case if the feedback did not concomitantly include the transistor 1. Since only a low noise amplifier (LNA) stage is required in the circuit, the power consumption of the circuit is low.

The input signal "inp" and the output signal "inn" which has been fed back can be interpreted as being components of a differential signal input of the circuit. The input stage thus comprises a differential signal input, in the case of which the input signal "inp" is supplied at a connection 2 and the output signal "inn" which has been fed back is supplied at a second connection. A DC offset is additionally produced between the input signal "inp" and the output signal "inn" which has been fed back, said offset being able to be used as level conversion between the input and the output.

The linearity of the circuit is high on account of the closed loop. Scattering on account of temperature fluctuations, fluctuations in the production parameters and fluctuations in the supply voltage is low.

The bulk connection of the transistor 1, which is not depicted in the present case, can be connected either to the source connection of the transistor or to another circuit node. Connection to the source connection has the advantage that the effective gate-bulk capacitance is reduced there.

A very low input capacitance can be achieved or the latter can be reduced even further if the positive input voltage "inp" is effectively shielded from the negative input "inn". It is thus possible to practically eliminate the parasitic gate-source capacitance which effectively acts on the input 2.

The drain-source capacitance of the transistor 1 may result in a Miller effect which could result in undesirable signal properties at particular signal frequencies. In this case, a cascode transistor 10 may be assigned to the transistor 1, for example. This is explained below with reference to FIG. 2.

Figure 2:
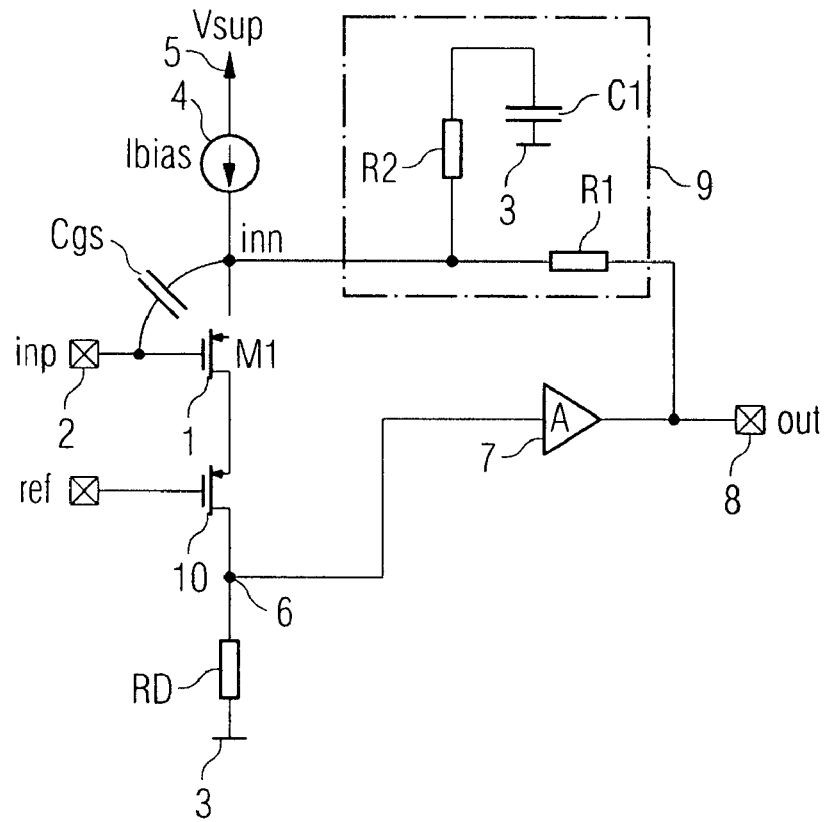
FIG. 2 shows a development of the circuit of FIG. 1 with a cascode.

FIG. 2 shows a development of the circuit of FIG. 1, which largely corresponds to the latter in terms of design, the components used, the way in which the latter are connected to one another and the advantageous method of operation. However, provision is additionally made of a cascode transistor 10 which is connected between the drain connection of the transistor 1 and the resistor RD, thus the circuit node 6. The input of the output stage 7 is also connected to the circuit node 6. A constant reference potential "ref" can preferably be supplied to the input of the cascode transistor 10.

The additional cascode stage can advantageously be used to avoid the frequency-dependent Miller effect.

In alternative refinements with regard to FIGS. 1 and 2, it goes without saying that the output stage 7 may also be of multistage design in order to achieve a three-stage, four-stage or multistage amplifier, depending on the application.

The proposed circuit, as is explained by way of example with reference to FIGS. 1 and 2, is particularly suitable as an analog signal amplifier. It is distinguished by a low effective input capacitance, a high input impedance, a low power consumption and low input noise.

Figure 3:
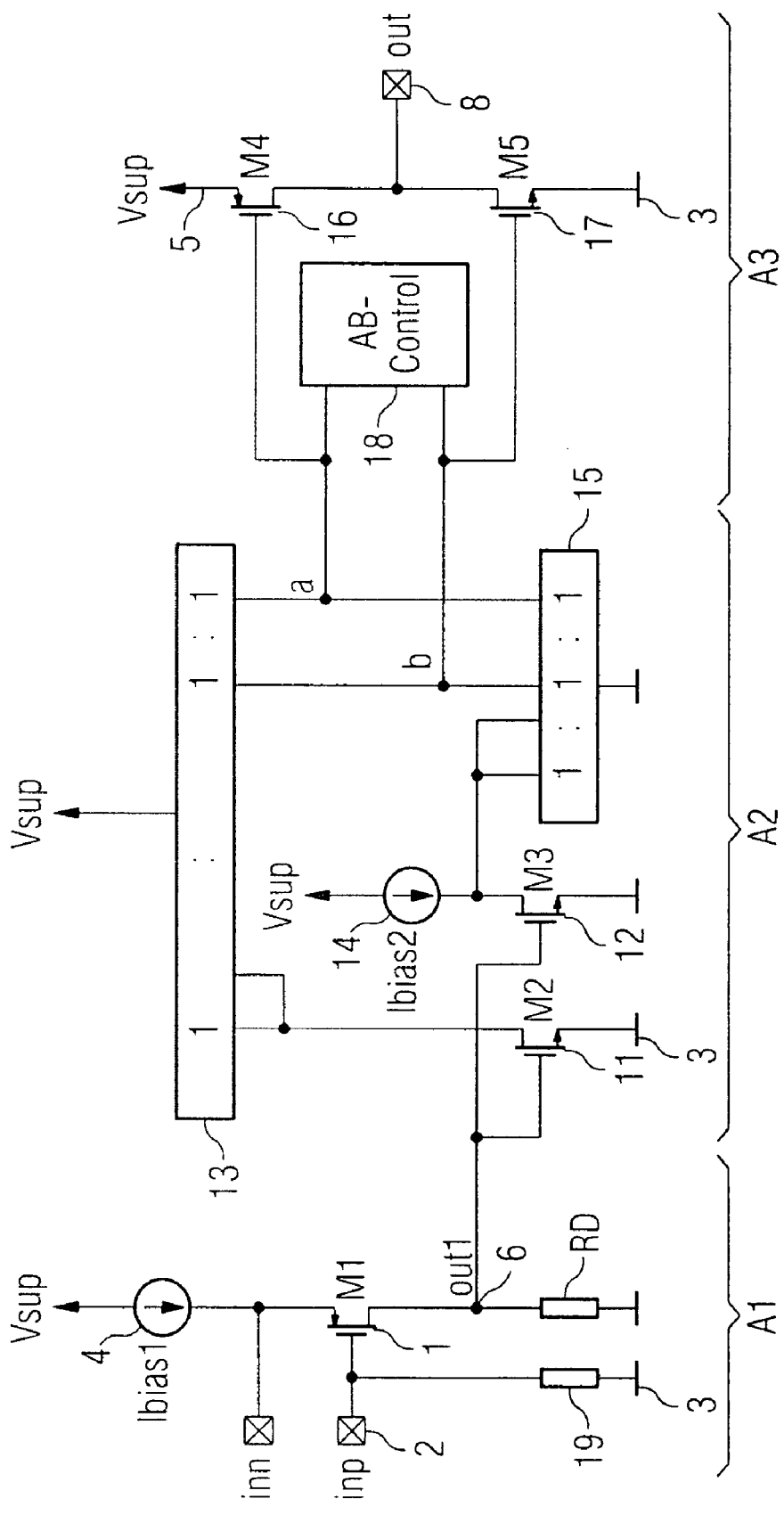
FIG. 3 shows an exemplary circuit diagram of one embodiment of the amplifier according to proposed principle with an AB output stage.

FIG. 3 shows an exemplary embodiment of the proposed principle with a three-stage amplifier which is divided into an input stage A1, an intermediate stage A2 and an output stage A3. The feedback path 9 which connects the output connection 8 to the circuit node between the transistor 1 and the bias current source 4, at which the feedback signal "inn" can be supplied, is not depicted in FIG. 3. This feedback path can be supplemented, for example, as explained with reference to FIGS. 1 and 2.

In addition to the input stage of FIG. 1, the input stage A1 of FIG. 3 contains a resistor 19 which connects the input 2 to the reference potential connection 3. This makes it possible to set the DC operating point of the transistor 1, depending on the signal source.

Instead of the output stage 7 of FIG. 1, a multistage amplifier arrangement comprising the intermediate stage A2 and the output stage A3 is connected between the circuit node 6 and the output 8 in FIG. 3. The intermediate stage A2 comprises two further transistors 11, 12 which are each in the form of N-channel MOS transistors and the gate connections of which are connected to the circuit node 6. The transistor 11 is connected into a current path between a first current mirror 13 and the reference potential connection 3. The third transistor 12 is connected into a current path between a further bias current source 14 and a second current mirror 15.

Figure 4:
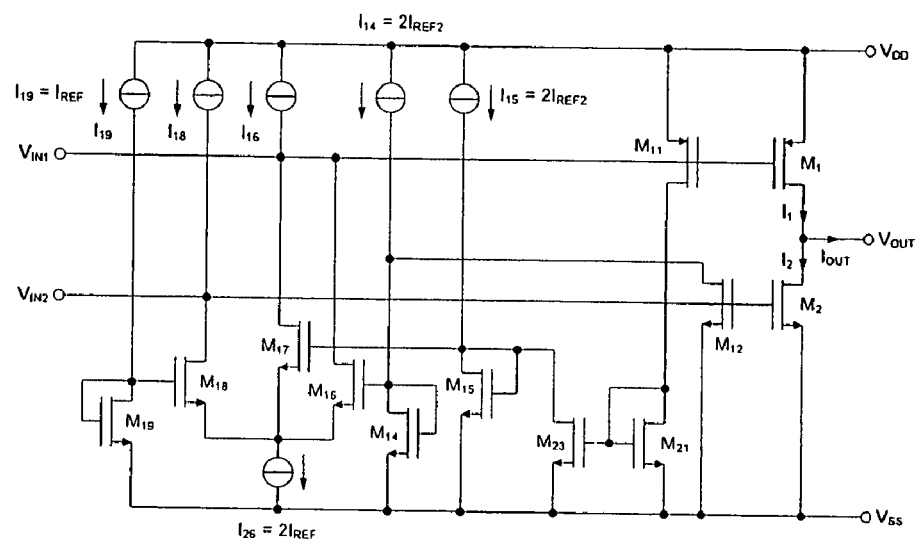
FIG. 4 shows an exemplary implementation of the class AB control circuit shown in FIG. 3.

The first and second current mirrors 13, 15 each have two output paths which are formed together in order to provide AB signals for a class AB output stage. The two circuit nodes of the common output paths of the current mirrors 13, 15 are connected, on the one hand, to control connections of the transistors 16, 17 of the output stage. On the other hand, the control connections of the output transistors 16, 17 are connected to a class AB control circuit 18. An exemplary implementation of this circuit is shown in FIG. 4.

The AB control circuit normally is not on a separate chip but is integrated together with the rest of the circuit (for example, the circuit shown in FIG. 3). In FIG. 4, M1 corresponds to M4 of FIG. 3, and M2 to M5 (M4 and M5 form the output stage in the circuitry of FIG. 3). Other implementations can readily occur to a person with ordinary skill in the art.

The transistors 16, 17 form a push-pull or class AB output stage A3 and are connected in a series circuit between the supply potential connection 5 and a reference potential connection 3, the output 8 being formed between the drain connections of the transistors 16, 17. Whereas the transistor 16 of the output stage is in the form of a P-channel transistor, the transistor 17 is in the form of an N-channel transistor.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the examples.

We claim:

1. An amplifier arrangement comprising:
    an input stage comprising a first transistor connected to an input configured to supply an input signal;
    an intermediate stage having an input that is coupled to the first transistor for receiving the input signal from the first transistor, the intermediate stage comprising a second transistor;
    a current source configured to bias the intermediate stage;
    at least one output stage coupled to an output of the intermediate stage at an input of the output stage which provides an output signal at an output; and
    a feedback path that connects the output of the output stage to the first transistor, wherein
    the input of the at least one output stage is connected to a first connection of a controlled path of the first transistor;
    the feedback path is connected to a second connection of the controlled path of the first transistor, and
    a control input of the second transistor is coupled to an output of the input stage.

2. The amplifier arrangement as claimed in claim 1, wherein the first transistor is a p-channel field effect transistor.

3. The amplifier arrangement as claimed in claim 1, wherein the first transistor is an n-channel field effect transistor.

4. The amplifier arrangement as claimed in claim 1, wherein the feedback path comprises a resistor connected between the output of the output stage and the first transistor.

5. The amplifier arrangement as claimed in claim 1, wherein the feedback path comprises a parallel path connected to the feedback path on the first transistor side and has a series circuit comprising a resistor and/or a capacitor.

6. An amplifier arrangement comprising:
    an input stage comprising a first transistor connected to an input configured to supply an input signal;
    an intermediate stage having an input that is coupled to the first transistor for receiving the input signal from the first transistor, the intermediate stage comprising a second transistor;
    a current source configured to bias the intermediate stage;
    at least one output stage coupled to an output of the intermediate stage at an input of the output stage which provides an output signal at an output; and
    a feedback path which connects the output of the output stage to the first transistor, wherein the input stage is set up to convert the level of the input signal.

7. The amplifier arrangement as claimed in claim 1, wherein the input stage comprises a resistor that couples a connection of the controlled path of the first transistor to a supply or reference potential connection.

8. The amplifier arrangement as claimed in claim 1, wherein the input stage comprises a bias current source that is connected to the first transistor.

9. The amplifier arrangement as claimed in claim 7, wherein the bias current source, the first transistor and the resistor of the input stage are arranged in a common current path.

10. An amplifier arrangement comprising:
    an input stage comprising a first transistor connected to an input configured to supply an input signal;

an intermediate stage having an input that is coupled to the first transistor for receiving the input signal from the first transistor, the intermediate stage comprising a second transistor;

a current source configured to bias the intermediate stage;

at least one output stage coupled to an output of the intermediate stage at an input of the output stage which provides an output signal at an output; and a feedback path which connects the output of the output stage to the first transistor, wherein the output stage comprises two transistors that can be driven by a class AB control circuit.

11. An amplifier arrangement comprising:

an input stage comprising a first transistor connected to an input configured to supply an input signal;

an intermediate stage having an input that is coupled to the first transistor for receiving the input signal from the first transistor, the intermediate stage comprising a second transistor;

a current source configured to bias the intermediate stage;

at least one output stage coupled to an output of the intermediate stage at an input of the output stage which provides an output signal at an output; and a feedback path which connects the output of the output stage to the first transistor, wherein the input stage comprises a cascode stage.

12. A method for amplifying a signal, comprising the steps of:

amplifying an input signal using a transistor and providing an intermediate signal that is derived from the input signal;

amplifying the intermediate signal using a second transistor and providing an intermediate output signal that is derived from the intermediate signal;

biasing the second transistor with a current source;

amplifying the intermediate output signal and providing an output signal which is derived from the intermediate output signal; and feeding a feedback signal, which is derived from the output signal, back to the transistor, wherein the intermediate signal is tapped off at a connection of a controlled path of the transistor, and the output signal is fed back at another connection of the controlled path of the transistor.

13. The method as claimed in claim 12, wherein the transistor is connected for the purpose of carrying out level conversion.

14. The method as claimed in claim 12, wherein the output signal is fed back via a resistance network comprising at least two resistors, the gain being able to be set on the basis of the resistance ratio of the at least two resistors.

15. The method as claimed in claim 12, wherein a bias current is supplied to the transistor.

16. The method as claimed in claim 12, wherein a gain of an input stage comprising the transistor can be set using a resistor that is connected to the transistor.

17. An amplifier arrangement comprising:

an input stage comprising a first transistor connected to an input configured to supply an input signal;

an intermediate stage having an input that is coupled to the first transistor for receiving the input signal from the first transistor, the intermediate stage comprising a second transistor;

a current source configured to bias the intermediate stage;

at least one output stage coupled to an output of the intermediate stage at an input of the output stage which provides an output signal at an output;

a feedback path that connects the output of the output stage to the first transistor; and a current mirror coupled between the intermediate stage and the output stage.

18. The amplifier arrangement as claimed in claim 1, wherein the stages are coupled to each other without an AC coupling capacitor.

* * * * *